United States Patent
Murase

Patent Number: 5,448,163
Date of Patent: Sep. 5, 1995

[54] METER DRIVE INCLUDING A TIMER FOR GENERATING UPDATE CYCLES AT A FREQUENCY LARGER THAN THE INPUT CLOCK PULSES AND DIGITAL FILTERING

[75] Inventor: Hiroshi Murase, Kyoto, Japan

[73] Assignee: Rohm Co., Ltd., Kyoto, Japan

[21] Appl. No.: 99,567

[22] Filed: Jul. 30, 1993

[30] Foreign Application Priority Data

Jul. 30, 1992 [JP] Japan .................. 4-203506

[51] Int. Cl.$^6$ .................................. G01R 11/36
[52] U.S. Cl. .................... 324/143; 324/166; 324/167
[58] Field of Search ............ 324/140 R, 140 D, 143, 324/144, 146, 166, 160, 167; 364/565, 569, 572

[56] References Cited

U.S. PATENT DOCUMENTS

| | | | |
|---|---|---|---|
| 4,988,944 | 1/1991 | Ito | 324/143 |
| 5,017,861 | 5/1991 | Hukuda | 324/143 |
| 5,051,688 | 9/1991 | Murase et al. | 324/140 R |
| 5,218,291 | 6/1993 | Murase | 324/143 |
| 5,313,155 | 5/1994 | Yamamoto et al. | 324/143 |
| 5,315,536 | 5/1994 | Murase et al. | 324/143 |
| 5,357,196 | 10/1994 | Ito | 324/166 |

FOREIGN PATENT DOCUMENTS 62-66303 4/1987 Japan .
64-69914 3/1989 Japan .

*Primary Examiner*—Sandra L. O'Shea
*Assistant Examiner*—Roger Phillips
*Attorney, Agent, or Firm*—Fish & Richardson

[57] ABSTRACT

There is disclosed a meter driving device which can perform a smooth indication through a simple process in response to an input pulse even if the frequency of the input pulse is relatively low.

An edge detector generates a one-shot pulse each time the edge of an input pulse is detected by the edge detector. CPU performs a digital filtering process to the one-shot pulse in response to a start signal having a constant update cycle that is provided from a timer. Thus, the high-frequency components are removed from the one-shot pulse so that a DC component is taken out to provide an angular shift $\theta$ of an indicating arm corresponding to the frequency of the input pulse. This DC component is used to move the indicating arm through a indicator drive device.

4 Claims, 5 Drawing Sheets

METER DRIVE INCLUDING A TIMER FOR GENERATING UPDATE CYCLES AT A FREQUENCY LARGER THAN THE INPUT CLOCK PULSES AND DIGITAL FILTERING

BACKGROUND OF THE INVENTION

1. Field of the Invention

The present invention relates to a meter driving device and particularly to such a device for driving a cross-coil meter that electrically energizes two coils extending perpendicular to each other to generate a magnetic field which provides a desired azimuth.

2. Description of the Invention

There is known such a cross-coil meter that electrically energizes two exciting coils extending perpendicular to each other to create a magnetic field which in turn provides a torque to a rotatably supported magnet to indicate a desired azimuth. These cross-coil meters are currently used in speed meters, tachometers and other meters in motorcars and so on.

FIGS. 4 and 5 show the schematic arrangement of a cross-coil meter according to the prior art.

The cross-coil meter comprises two exciting coils $L_S$ and $L_C$ which are arranged to extend perpendicular to each other. When these exciting coils are energized by an electric current depending on an input, such as from a motorcar speed meter, they generate a magnetic field corresponding to a desired azimuth. The rotatably supported permanent magnet is rotated by a torque from the magnetic field generated by the two exciting coils $L_S$ and $L_C$.

An indicating arm is fixedly mounted on the permanent magnet. The indicating arm is angularly shifted from a reference position by an angle 8 such that it indicates a given position on a meter indicating plate on which is printed a physical quantity to be measured. For example, as shown in FIG. 5, vehicle speeds may be printed on the meter indicating plate.

A device for driving such a cross-coil meter generally receives pulse signals having frequencies which are variable depending on the amount of input (e.g. vehicle speed). The pulse signals are measured by counting the number of pulses in reference clock signals which are generated by a reference clock generating means. More particularly, if it is assumed that input pulse signal cycles are $T_1$, $T_2$, $T_3$ and so on, each of these cycles is measured by counting the number of pulses of the reference clock signals to compute frequencies $F=1/T_1$, $F=1/T_2$, $F=1/T_3$ and so on.

Electric currents corresponding to these computed frequencies are subjected to pulsewidth modulation before they are provided to the exciting coils $L_S$ and $L_C$ which are arranged to extend perpendicularly to each other.

The meter driving device of the prior art raises a problem from the fact that the cycles T of input pulse signals are measured with their inverse numbers being then computed to determine input frequencies $F=1/T$, as described. For example, if the device is used to drive a speed meter, the input cycle is very prolonged during low-speed running (several kilometers per hour) with its frequency becoming several Hertz. Since the frequency is updated after an increased period of time, the indicating arm will be moved or shifted intermittently and will not provide a smooth indication.

If any modification is made to provide a smooth indication in the basic structure of the prior art, another problem is raised in that the whole arrangement becomes complicated and the scale of the circuit is increased.

SUMMARY OF THE INVENTION

It is therefore an object of the invention to provide a meter driving device which can provide a smooth indication exactly corresponding to input pulses even if their frequency decreases.

To this end, the present invention provides a meter driving device for use in a meter indicator adapted to perform the indication of an indicating arm depending on the frequency of the input signal, the meter driving device comprising an edge detector for detecting the edge of an input pulse to generate a one-shot pulse, a timer for generating a start signal upon the passage of each updating cycle, a digital filter for removing any high-frequency component from said one-shot pulse in response to said start signal, thereby taking out a DC component representative of the angular shift of the indicating arm corresponding to the frequency of said input pulse, and drive means for driving said indicating arm in response to the output of said digital filter.

In such an arrangement, the meter driving device of the present invention causes the edge detector to generate a one-shot pulse each time the edge of an input pulse is detected by the edge detector. The digital filter processes the one-shot pulse to remove its high-frequency components, in accordance with a given updating cycle which is outputted from the timer on the basis of the reference clock. The digital filter takes out a DC component representative of the angular shift 8 of the indication arm corresponding to the frequency of the input pulse. The DC component is then used to shift the indicating arm through the drive means.

BRIEF DESCRIPTION OF THE PREFERRED EMBODIMENTS

DETAILED DESCRIPTION OF THE PREFERRED EMBODIMENTS

Figure 1:
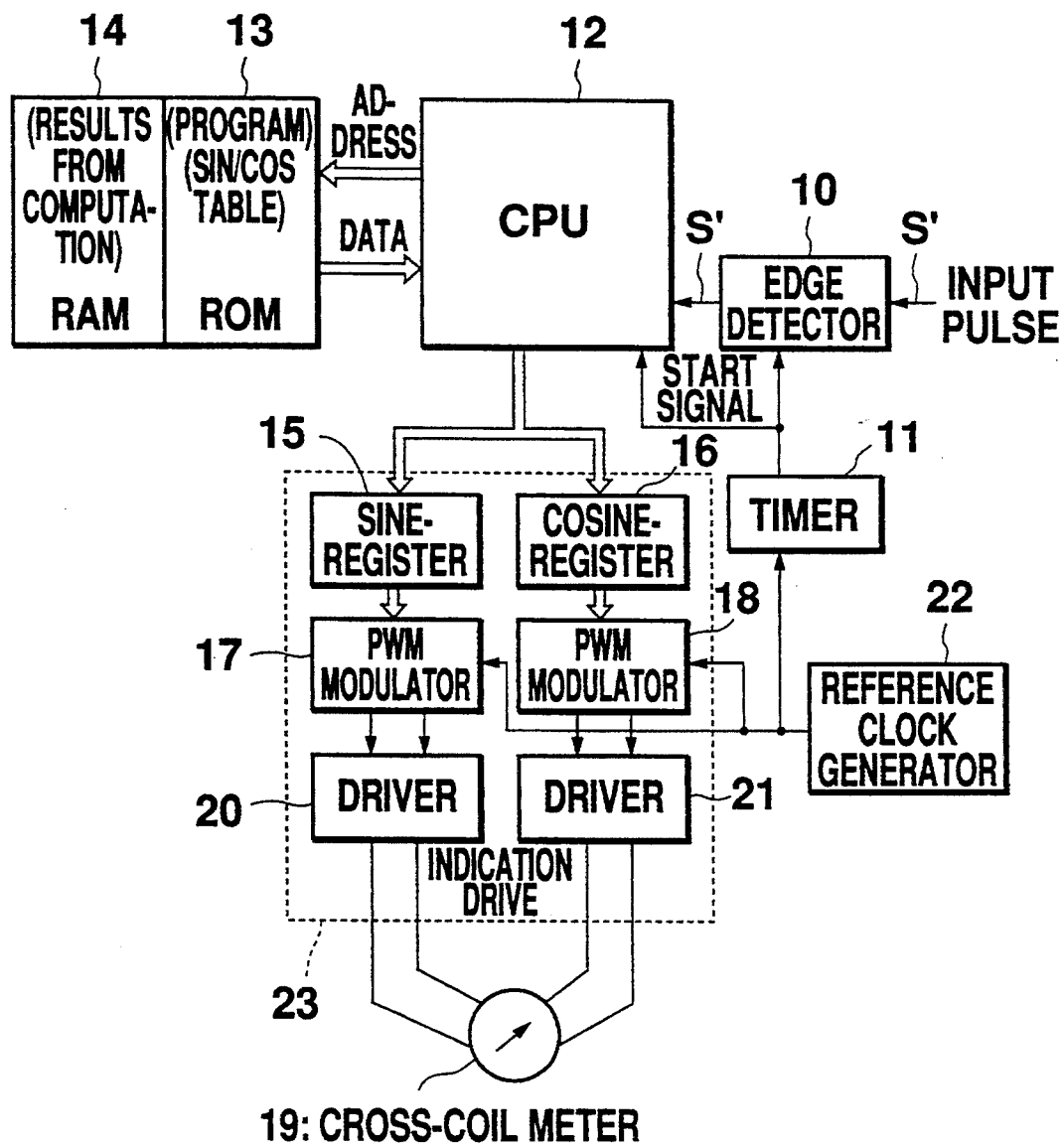
FIG. 1 is a block diagram of one embodiment of a meter driving device constructed in accordance with the present invention.

Referring now to FIG. 1, there is shown a meter driving device constructed in accordance with the present invention, which comprises an edge detector 10 for detecting the edge of an input pulse S. The edge detector 10 is connected to a timer 11 for generating a start signal. The edge detector 10 is adapted to generate a one-shot pulse S' each time the edge of a input pulse is detected by the edge detector 10.

The edge detector 10 is further connected to a CPU 12 for performing digital filtering and sin/cos conversion. The CPU 12 is also connected to a ROM 13, in which is stored a program and a sin/cos conversion table, and a RAM 14 used to store results and intermediate values from the computation of the CPU 12 which functions as a digital filter.

Figure 4:
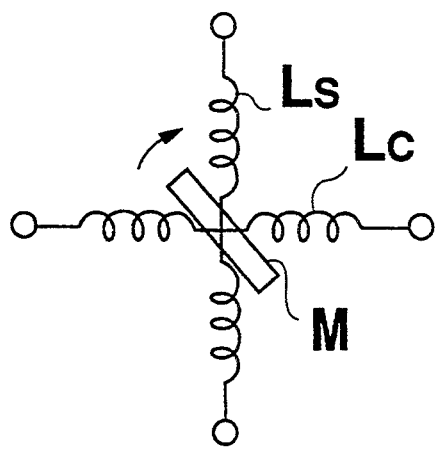
FIG. 4 is a view showing the exciting coils in a cross-coil meter.
Figure 5:
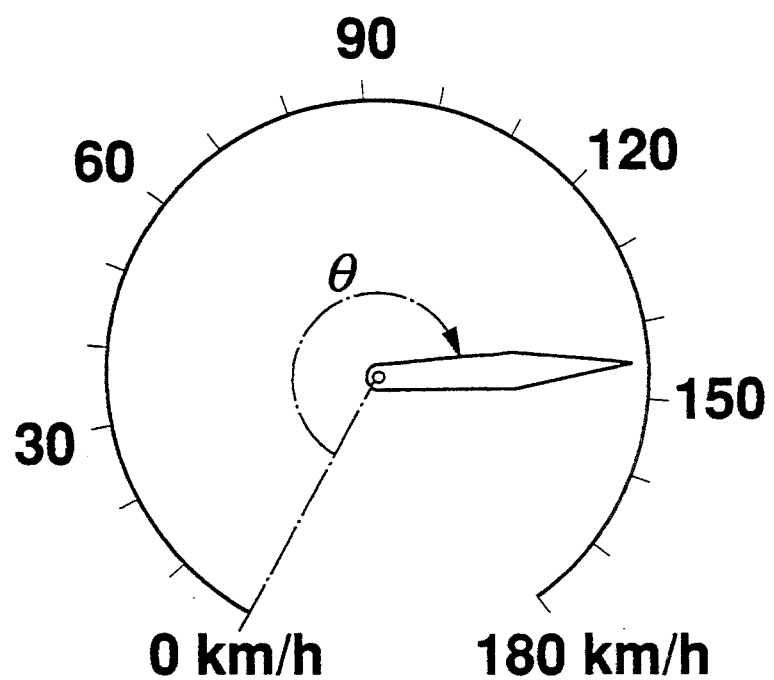
FIG. 5 is a view showing the outline of the cross-coil meter.
Figure 6:
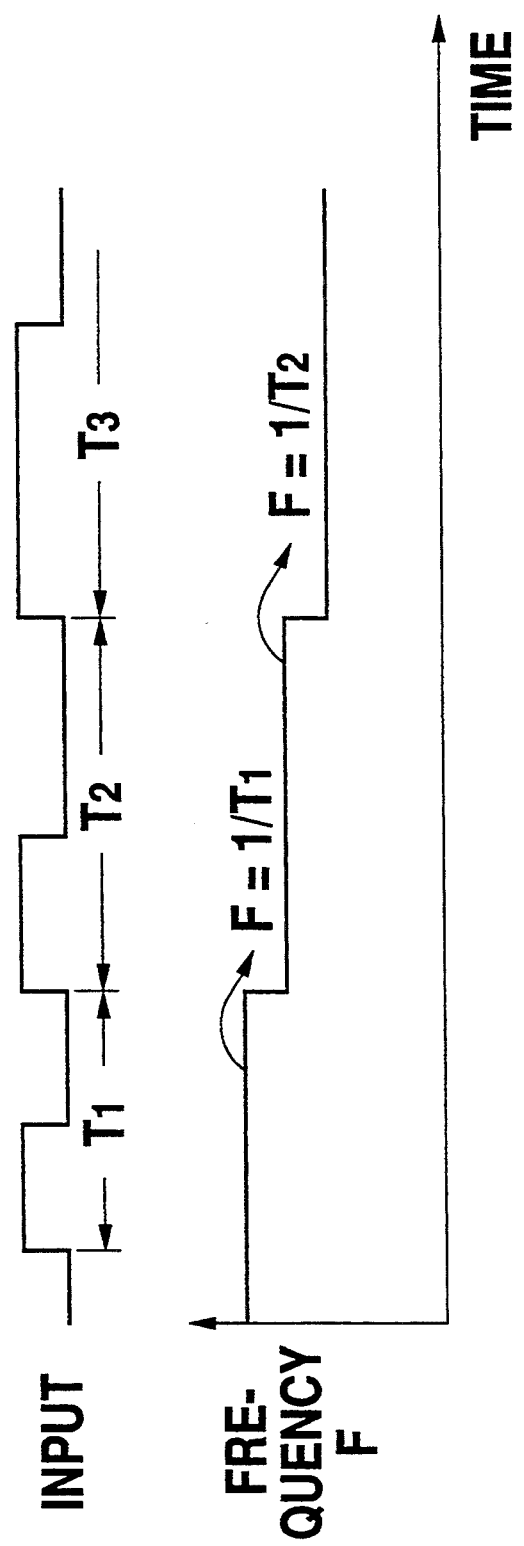
FIG. 6 is a graph illustrating the operation of a meter driving device constructed in accordance with the prior art.

The CPU 12 is further connected to a sine-register and a cosine-register 15, 16 which function to store the output signals of the CPU 12 that are results from the computation thereof. The sine-register and cosine-register 15, 16 are respectively connected to PWM modulators 17, 18 each of which is adapted to execute the PWM modulation to the output data of the respective register 15, 16. Each of the PWM modulators 17 and 18 is connected to a driver 20 or 21 for driving the corresponding one of two exciting coils $L_S$ and $L_C$ (FIG. 4) in a cross-coil meter 19.

A reference clock generator 22 is connected to the timer 11 and PWM modulators 17, 18. An indicator drive means 23 is defined by the sine-register 15, cosine-register 16, PWM modulators 17, 18 and drivers 20, 21.

On operation, the timer 11 generates a constant update cycle $\Delta t$ from reference clocks which are generated by a reference clock generator 22, this update cycle being used to update a meter indicating value in the computation at the digital filter. The timer 11 generates a start signal on each update cycle $\Delta t$. The edge detector 10 detects whether or not there is the edge of an input pulse within the update cycle $\Delta t$.

Figure 2:
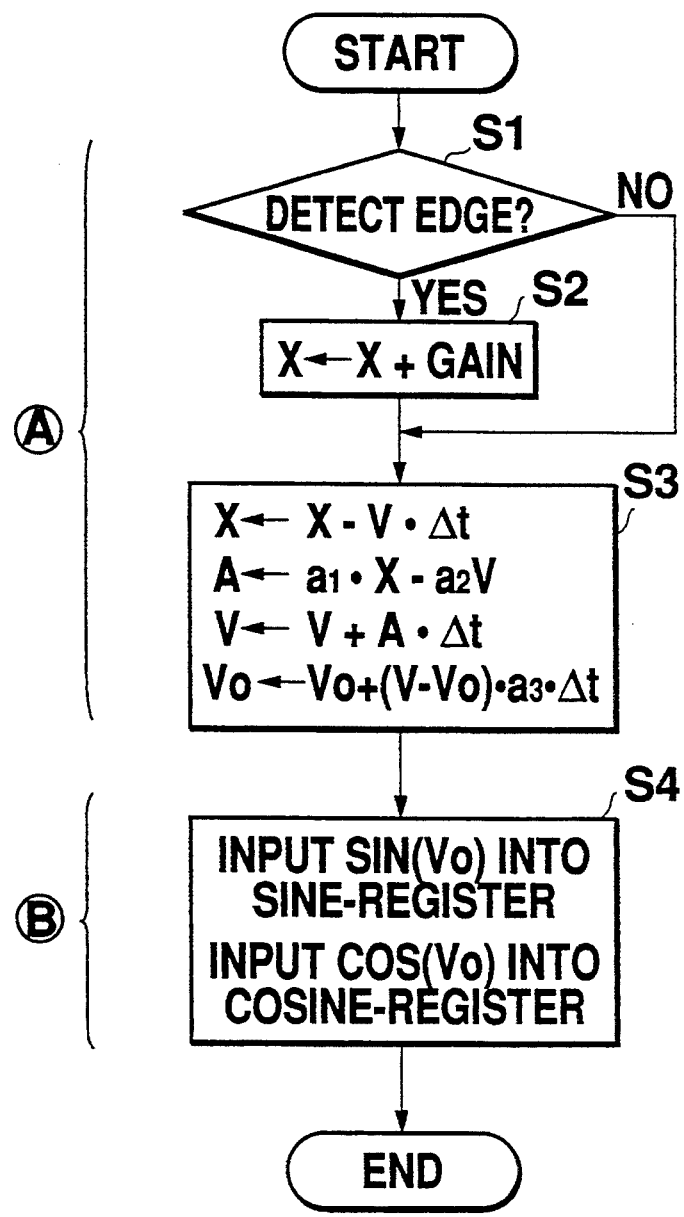
FIG. 2 is a flowchart illustrating the operation of the meter driving device shown in FIG. 1.

When the CPU 12 receives a start signal from the timer 11 at each update cycle $\Delta t$, the CPU 12 responds to this start signal to execute a series of steps shown by the flowchart of FIG. 2. At a section A in the flowchart, the digital filter processes the input data through its function as a three-order low pass filter. Constants $a_1$, $a_2$ and $a_3$, which are used to determine cut-off frequencies, are stored in the ROM 13. The parameters X, V and $V_0$, which are determined at the preceding step, are stored in the RAM 14.

When the process is started, at the first step S1, the edge detector 10 detects whether or not there is the edge of an input pulse S. If there is the edge of the input pulse S, at the second step S2, the parameter X stored in the RAM 14 is read out to compute a constant X+GAIN (which is used to determine the angular shift of the meter indicating arm), thereby determining a new value X.

At the third step S3, the following computations are carried out in accordance with the update cycle $\Delta t$, using the parameters X, A, V and $V_0$ read from the RAM 14:

$$X \leftarrow X - V \times \Delta t$$

$$A \leftarrow a_1 \times X - a_2 \times V$$

$$V \leftarrow V + A \times \Delta t$$

$$V_0 \leftarrow V_0 + (V - V_0) \times a_3 \times \Delta t$$

Figure 3:
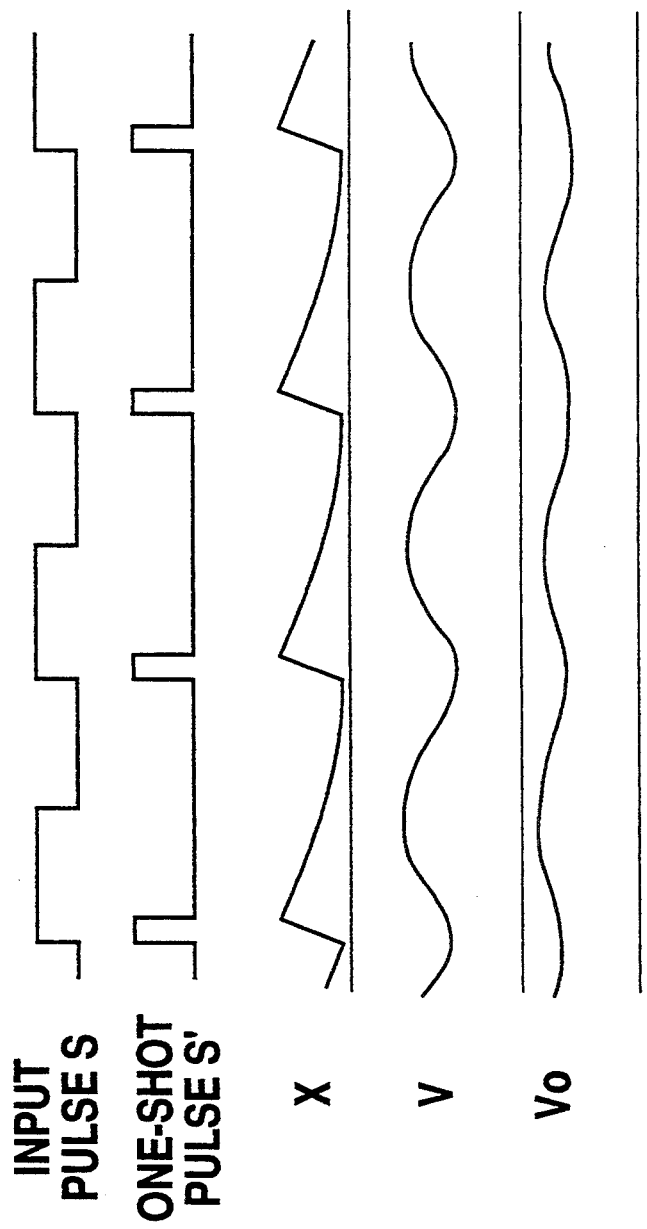
FIG. 3 is a view illustrating the digital filtering process in the meter driving device shown in FIG. 1

More particularly, as shown in FIG. 3, a one-shot pulse S' produced by the edge detector 10 each time the edge of an input pulse S is detected by the edge detector 10 is processed by the digital filter 12 to remove its high-frequency components, thereby taking out a DC component $V_0$ which provides the angular shift $\theta$ of the meter indicating arm in response to the frequency of the input pulse.

At another section B in the flowchart, the sin/cos conversion and the updating of the meter indication are carried out. At the fourth step S4, the DC component $V_0$ taken out at the third step S3 is inputted into the sine-register 15 as a sin ($V_0$) and into the cosine-register 16 as a cos ($V_0$) to update the contents of these registers at each update cycle $\Delta t$.

The PWM modulators 17 and 18 perform their PWM modulation respectively in accordance with the values of the sine-register and cosine-register 15, 16, the outputs of the PWM modulators 17 and 18 being then supplied to the respective drivers 20, 21. Each of the drivers 20 and 21 electrically energizes the respective one of the sine- and cosine-coils in the cross-coil meter with electric currents corresponding to the outputs of the PWM modulators. Thus, the indicating angle $\theta$ in the cross-coil meter 19 will be changed to perform an indication corresponding to the frequency of the input pulse.

If such a process is carried out while setting the update cycle $\Delta t$ to a sufficiently short period of time, the meter indicating arm can more smoothly be moved to provide a smooth indication.

In accordance with the present invention, the updating of the indication is carried out through each constant update cycle $\Delta t$ independently of the input pulse cycle, whereby the smooth indication of the meter can be provided even if the input pulse cycle is relatively long. And yet such a smooth indication of the meter can be provided by a simplified circuit arrangement which performs a simple computation without the need for any complicated process.

I claim:

1. A meter driving device for use in a meter indicator adapted to position an indicating arm based on the frequency of an input signal, the meter driving device comprising:

an edge detector for detecting an edge of each of a series of input pulses to generate a one-shot pulse corresponding to each of said input pulses;

a timer for generating a start signal at the beginning of each of multiple updating cycles, the start signal being generated at a frequency that is larger than a frequency of the series of input pulses, a digital filter connected to the edge detector for removing any high-frequency components from said one-shot pulses, an output of the digital filter being updated in response to each start signal, the output of the digital filter representing the position of the indicating arm and corresponding to the frequency of said series of input pulses, and drive means for positioning said indicating arm in response to the output of said digital filter.

2. A meter driving device as defined in claim 1 wherein said digital filter is a third-order low pass filter.

3. A meter driving device as defined in claim 1 wherein said meter indicator is a cross-coil meter including two coils extending perpendicular to each other, said two coils being electrically energized to generate a magnetic field providing a desired azimuth and wherein said drive means comprises;

a sine-register for holding a sine value that is converted from the DC component obtained by said digital filter, a cosine-register for holding a cosine value that is converted from the DC component obtained by said digital filter, a first pulse modulator for performing a pulsewidth modulation to the output of said sine-register, a second pulsewidth modulator for performing the pulsewidth modulation to the output of said cosine-register, a first driver for providing the output of said first pulsewidth modulator to the first one of said two coils, and a second driver for providing the output of said second pulsewidth modulator to the second one of said two coils.

4. A meter driving device as defined in claim 1 wherein the frequency of the start signal from said timer is significantly larger than the frequency of said series of input pulses.

* * * * *